United States Patent
Tsuda et al.

(10) Patent No.: US 8,311,070 B2
(45) Date of Patent: *Nov. 13, 2012

(54) NITRIDE SEMICONDUCTOR LASER DEVICE

(75) Inventors: Yuhzoh Tsuda, Osaka (JP); Masataka Ohta, Osaka (JP); Yoshie Fujishiro, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/302,266

(22) Filed: Nov. 22, 2011

(65) Prior Publication Data

US 2012/0063986 A1 Mar. 15, 2012

Related U.S. Application Data

(62) Division of application No. 12/591,178, filed on Nov. 12, 2009, now Pat. No. 8,085,826.

(30) Foreign Application Priority Data

Nov. 26, 2008 (JP) .................................. 2008-301104

(51) Int. Cl.
*H01S 5/00* (2006.01)

(52) U.S. Cl. .................... 372/45.01; 372/43.01; 438/946

(58) Field of Classification Search ............... 372/45.01, 372/43.01; 438/946
See application file for complete search history.

(56) References Cited

U.S. PATENT DOCUMENTS

| | | | |
|---|---|---|---|
| 5,777,350 A | 7/1998 | Nakamura et al. | |
| 6,493,367 B1 | 12/2002 | Ito et al. | |
| 8,085,826 B2 * | 12/2011 | Tsuda et al. | 372/45.01 |
| 2005/0226295 A1 | 10/2005 | Taneya et al. | |
| 2006/0098703 A1 | 5/2006 | Kuramoto | |
| 2007/0290230 A1 * | 12/2007 | Kawaguchi et al. | 257/196 |
| 2008/0293176 A1 | 11/2008 | Oka et al. | |

FOREIGN PATENT DOCUMENTS

| | | |
|---|---|---|
| JP | 05-243669 | 9/1993 |
| JP | 9-36430 | 2/1997 |
| JP | 11-074621 | 3/1999 |
| JP | 2001-85796 | 3/2001 |
| JP | 2004-063537 | 2/2004 |
| JP | 2004-104088 | 4/2004 |
| JP | 2006-135221 | 5/2006 |
| JP | 2006-278416 | 10/2006 |
| JP | 2007-095857 | 4/2007 |
| JP | 2008-028121 | 2/2008 |
| JP | 2008-53760 | 3/2008 |
| JP | 2008-251683 | 10/2008 |
| JP | 2008-273835 | 11/2008 |
| WO | WO 2005/034301 | 4/2005 |

* cited by examiner

*Primary Examiner* — Kinam Park

(74) *Attorney, Agent, or Firm* — Harness, Dickey & Pierce, P.L.C.

(57) ABSTRACT

A nitride semiconductor laser device includes an n-type AlGaN clad layer, a GaN layer, a first InGaN light guide layer, a light-emitting layer, a second InGaN light guide layer, a nitride semiconductor inter mediate layer, a p-type AlGaN layer, and a p-type AlGaN clad layer stacked in this order on a nitride semiconductor substrate, wherein the n-type AlGaN clad layer has an Al composition ratio of 3-5% and a thickness of 1.8-2.5 μm; the first and second InGaN light guide layers have an In composition ratio of 3-6%; the first light guide layer has a thickness of 120-160 nm and greater than that of the second light guide layer; and the p-type AlGaN layer is in contact with the p-type clad layer and has an Al composition ratio of 10-35% and greater than that of the p-type clad layer.

11 Claims, 4 Drawing Sheets

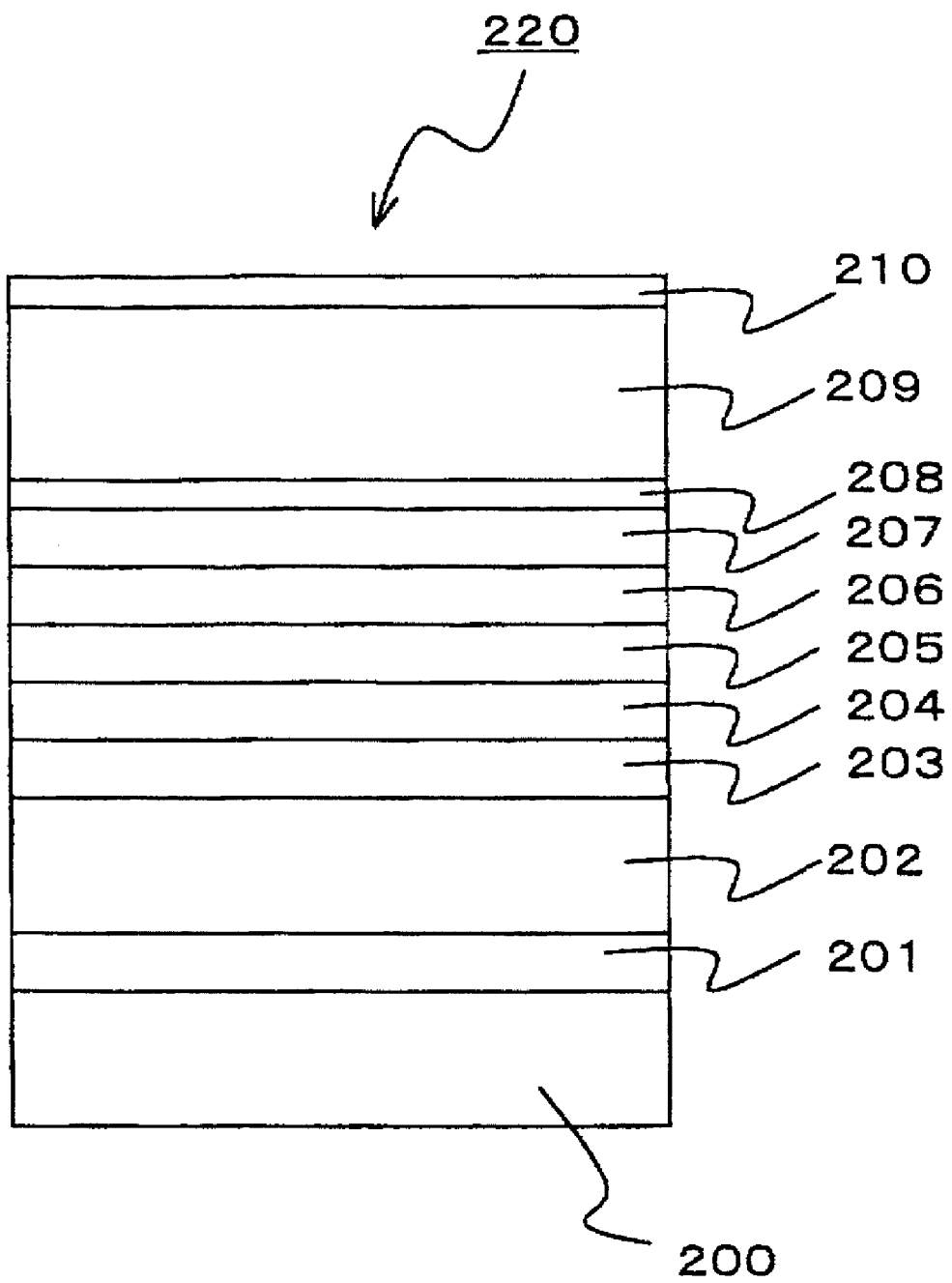

NITRIDE SEMICONDUCTOR LASER DEVICE

PRIORITY STATEMENT

This application is a divisional under 35 U.S.C. §121 of U.S. application Ser. No. 12/591,178, filed Nov. 12, 2009, now U.S. Pat. No. 8,085,826 which claims priority under 35 U.S.C. §119 to Japanese Application No. 2008-301104, filed on Nov. 26, 2008 with the Japanese Patent Office, the entire contents of each of which are hereby incorporated herein by reference.

BACKGROUND

1. Technical Field

The present invention is related to a nitride semiconductor laser device having an emission wavelength in a range of 430 nm to 540 nm and particularly to a nitride semiconductor laser device improved in laser characteristics and a method for forming the same.

2. Description of the Related Art

Japanese Patent Laying-Open No. 05-243669 teaches to shift the center of a waveguide mode toward an n-type clad layer side in a laser device including an AlGaInP active layer (to reduce the light-confinement effect on the side where the active layer is in contact with an n-type layer) by introducing an asymmetrical structure in which an optical guide layer on the n-type clad layer side is made thicker than the other optical guide layer on a p-type clad layer side. With the asymmetrical structure, it is possible to reduce light absorption in the vicinity of each end face of the laser device and increase the output level at which catastrophic optical damage occurs, thereby to increase the possible output level of the laser device.

In a nitride semiconductor laser device using InGaN material, on the other hand, there is a problem that the light confinement effect in the light-emitting layer (active layer) is inherently low in a lasing wavelength range of not shorter than 430 nm. This low light confinement effect causes decrease of the internal (and external) quantum efficiency and increase of the threshold lasing current density in the laser device and particularly brings about disadvantage for the high output operation of the device. The reason for this low light confinement effect is that the refractive index difference between AlGaN material for the clad layer and GaN material for the light guide layer generally used in the nitride-based semiconductor laser device becomes smaller as the wavelength becomes longer. In general, in order to make the refractive index difference sufficient, the Al composition ratio (atomic ratio in the III group elements) is increased in AlGaN material for the clad layer and In is added to GaN material for the light guide layer and then the In composition ratio is increased as desired. The reason for this is that the Al acts to decrease the refractive index of GaN and the In acts to increase the refractive index of GaN.

In the case of obtaining sufficient refractive index difference between the clad layer and the light guide layer by adjusting the Al composition ratio and the In composition ratio, however, the crystal lattice mismatch is increased between those layers and then there is caused generation of cracks and increase of the operation voltage in the laser device. The reason of this is that the Al acts to decrease the lattice constant of GaN and the In acts to increase the lattice constant of GaN.

As a result of the present inventors' study, on the other hand, it was found that light leakage toward the p-type layer side due to the weak light confinement effect in the light-emitting layer causes increase of light absorption due to Mg of the p-type impurity. This disadvantageously results in decrease of the external quantum efficiency and increase of the threshold lasing current density.

SUMMARY

In view of the status of the prior art as described above, the object of the present invention is related to improvements of the characteristics such as decrease of the operation voltage, increase of the external quantum efficiency and decrease of the threshold lasing current density in the nitride semiconductor laser device having a emission wavelength in the range of not shorter than 430 nm.

According to the present invention, a nitride semiconductor laser device having a lasing wavelength in a range of 430 nm to 540 nm includes an n-type AlGaN clad layer, a GaN layer, a first InGaN light guide layer, a light-emitting layer, a second InGaN light guide layer, an intermediate layer of a nitride semiconductor, a p-type AlGaN layer, and a p-type AlGaN clad layer stacked in this order on a nitride semiconductor substrate, wherein the n-type AlGaN clad layer has an Al composition ratio in a range of 3% to 5% and a thickness in a range of 1.8 µm to 2.5 µm; the first and second InGaN light guide layers have an In composition ratio in a range of 3% to 6%; the first InGaN light guide layer has a thickness in a range of 120 nm to 160 nm and greater than that of the second InGaN light guide layer; and the p-type AlGaN layer is in contact with the p-type AlGaN clad layer and has an Al composition ratio in a range of 10% to 35% and greater than that of the p-type AlGaN clad layer.

It is preferable that a total thickness of the second InGaN light guide layer and the intermediate layer is in a range of 60 nm to 80 nm. The light-emitting layer can be formed of one quantum well layer or a stacked-layer structure of a quantum well layer/a barrier layer/a quantum well layer. It is preferable that first InGaN light guide layer has an In composition ratio in a range of 4% to 6%, and the GaN layer has a thickness in a range of 0.1 µm to 0.3 µm and serves as a clad layer. The intermediate layer can preferably be formed of GaN. It is preferable that the barrier layer is formed of InGaN and has the same In composition ratio as that of the first InGaN light guide layer.

A method for forming the nitride semiconductor laser device described above preferably includes the steps of crystal-growing by supplying a III group element source containing In and Ga, a first ammonia gas, and a first carrier gas containing nitrogen and hydrogen; interrupting the crystal-growing for a prescribed time period by stopping supply of the III group element source and supplying a second ammonia gas and a second carrier gas containing nitrogen and hydrogen; alternately repeating the crystal-growing step and the interrupting step to form the first or second InGaN light guide layer having a prescribed thickness. The prescribed thickness of the first InGaN light guide layer is preferably in a range of 120 nm to 160 nm.

In the method, it is preferable that the crystal-growing step produces at one time a crystal layer having a thickness in a range of 25 nm to 40 nm. The first carrier gas preferably contains hydrogen in a range of 1% to 20%. The second carrier gas preferably contains hydrogen having the same concentration as that in the first carrier gas. It is preferable that a total flow rate of the second ammonia gas and the second carrier gas is the same as that of the first ammonia gas and the first carrier gas. The second carrier gas preferably contains hydrogen of which proportion to the second ammonia gas is in a range of 1% to 35%. It is preferable that a flow rate of the second ammonia gas is greater than that of the first ammonia gas. It is also preferable that a flow rate of the second ammonia gas is in a range of 1.1 to 3 times that of the first ammonia gas. The second carrier gas preferably contains hydrogen in a range of 1% to 20%. It is preferable that the prescribed time period is in a range of 3 sec. to 180 sec.

With the present invention as described above, it becomes possible to obtain improvements such as decrease of the operation voltage, increase of the external quantum efficiency and decrease of the threshold lasing voltage in the nitride semiconductor laser device. It also becomes possible to attain decrease of the power consumption and increase of the output power in various display devices by using the improved laser device.

Incidentally, the application of the present invention is limited to a nitride semiconductor laser device having a lasing wavelength not longer than 540 nm, because it is difficult to obtain the effects of the present invention in a nitride semiconductor laser device having an emission wavelength longer than 540 nm.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a schematic cross-sectional view illustrating a wafer having a nitride semiconductor laser structure.

DETAILED DESCRIPTION

Figure 1:
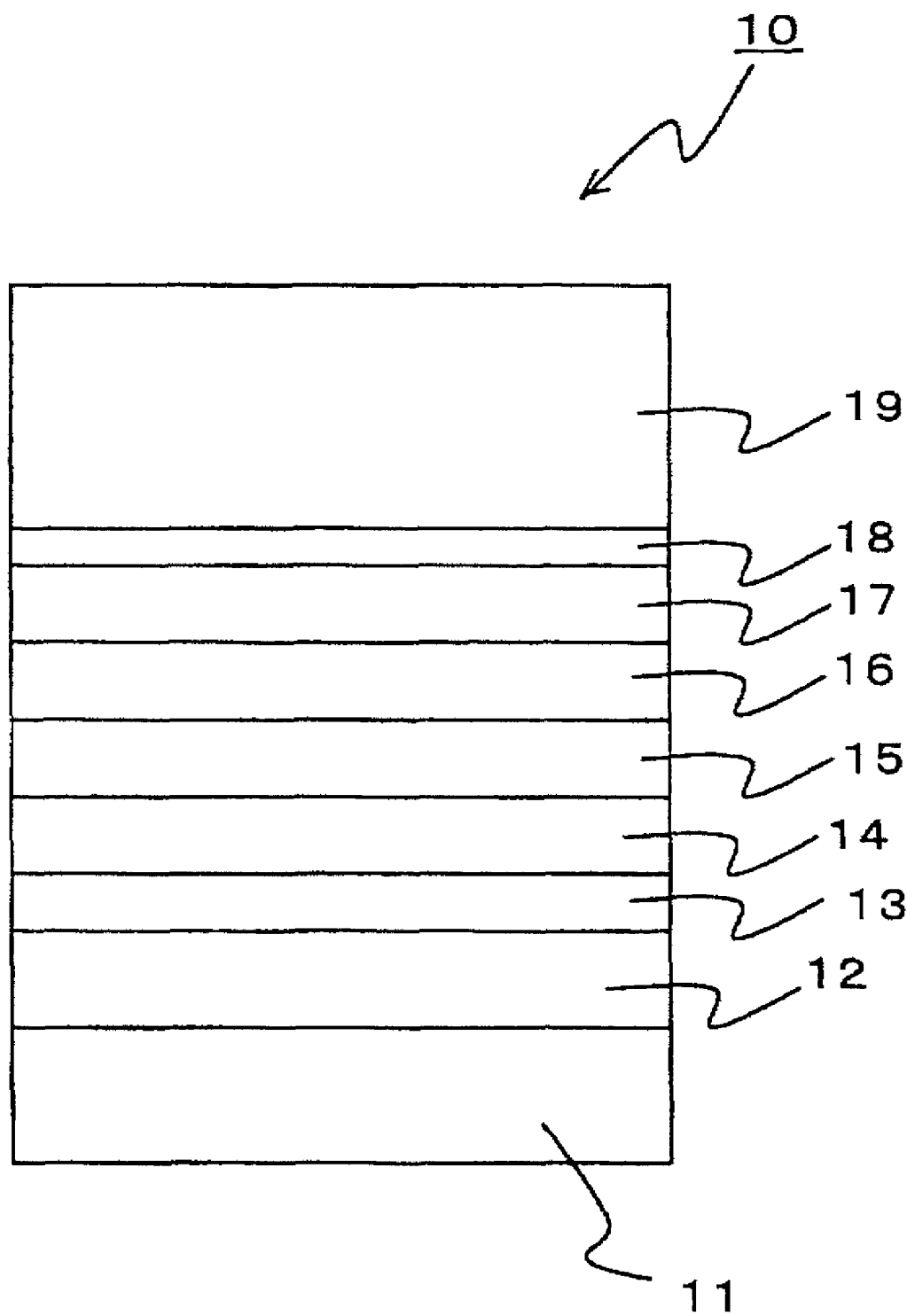
FIG. 1 is a schematic cross-sectional view of a stacked-layer structure in a wafer including a nitride semiconductor laser structure.

In the following, an Embodiment according to the present invention is described referring to the drawings. Incidentally, the length, width, thickness, and the like in the drawings are arbitrarily modified to clarify and simplify the drawings and thus do not represent the actual dimensional relationship. Particularly, the thickness is shown with arbitrary enlargement. In the drawings, the same reference numbers represent the same or corresponding portions.

EMBODIMENT

A schematic cross-sectional view of FIG. 1 illustrates a stacked-layer structure in a wafer 10 including a nitride semiconductor laser structure. This nitride semiconductor laser structure wafer 10 includes an n-type AlGaN clad layer 12, a GaN layer 13, a first InGaN light guide layer 14, a light-emitting layer 15, a second InGaN light guide layer 16, an intermediate layer of a nitride semiconductor 17, a p-type AlGaN layer 18, and a p-type AlGaN clad layer 19 stacked in this order on a nitride semiconductor substrate 11.

It is preferable to use GaN or AlGaN as a material for nitride semiconductor substrate 11. Use of an AlGaN substrate is particularly preferable from the viewpoint that it becomes possible to omit n-type AlGaN clad layer 12 and it is not necessary to take measures to suppress light leakage into the substrate. In the case of using a GaN substrate, light leakage into the substrate is problematic. The Al composition ratio of the AlGaN substrate is preferably not more than 6%. The main surface of nitride semiconductor substrate 11 can be a (0001) plane, a non-polar (1-100) plane or semi-polar (11-22) plane.

N-type AlGaN clad layer 12 can contain Si as a dopant. N-type AlGaN clad layer 12 may include a non-doped partial layer and/or partial layers having different Al composition ratios. In other words, n-type AlGaN clad layer 12 may have a superlattice structure of $Al_xGa_{1-x}N/Al_yGa_{1-y}N$ (x<y), $Al_xGa_{1-x}N/GaN$, or the like. Further, a partial layer in n-type AlGaN clad layer 12, which is in direct contact with GaN layer 13, can be a non-doped partial layer. Such a non-doped partial layer can prevent light absorption due to Si dopant in the vicinity of the interface.

The Al composition ratio of n-type AlGaN clad layer 12 is set in a range of 3% to 5%. In the case of using n-type AlGaN clad layer 12 having a superlattice structure of $Al_xGa_{1-x}N/Al_yGa_{1-y}N$ (x<y), $Al_xGa_{1-x}N/GaN$, or the like, the average Al composition ratio of the superlattice is set in a range of 3% to 5%. With such n-type AlGaN clad layer 12, it is possible to decrease the operation voltage and suppress generation of cracks in the semiconductor laser device.

In the case of n-type AlGaN clad layer 12 having a small Al composition ratio in the range of 3% to 5%, on the other hand, light tends to leak toward the substrate side, since light-emitting layer 15 has a lasing wavelength not shorter than 430 nm. Therefore, n-type AlGaN clad layer 12 preferably has a thickness of at least 1.8 μm. From the viewpoint of suppressing generation of cracks due to the lattice mismatch, on the other hand, n-type AlGaN clad layer 12 preferably has a thickness of at most 2.5 μm. Even in the case of using n-type AlGaN clad layer 12 having a thickness in such a range, however, it is difficult to make sufficient the light confinement effect in the light-emitting layer, and thus first InGaN light guide layer 14 is desirable as described later.

GaN layer 13 has a lattice constant between those of clad layer 12 and first light guide layer 14 and can serves as a buffer layer. Further, in the case that first light guide layer 14 described later has an In composition ratio of at least 4%, GaN layer 13 can also serve as a clad layer. This can improve the light confinement effect. GaN layer 13 preferably has a thickness in a range of 0.1 μm to 0.3 μm. With the thickness of least 0.1 μm, the region of the highest light intensity shifts toward the n-type layer side and thus light absorption due to magnesium (Mg) of a p-type dopant is suppressed so that improvement of the external quantum efficiency can be expected. However, it is not preferable that the thickness exceeds 0.3 μm, because light tends to leak toward the substrate side.

It is preferable that either of first InGaN light guide layer 14 and second InGaN light guide layer 16 has an In composition ratio in a range of 3% to 6%, and the former has a thickness in a range of 120 nm to 160 nm and greater than that of the latter. By using such a high In composition ratio and a large thickness, it becomes possible to make the Al composition ratio at most 5% in n-type AlGaN clad layer and improve the light confinement effect in the light-emitting layer region. As a result, it becomes possible to realize the low operation voltage and low threshold lasing current density in the laser device. It is noted that an InGaN light guide layer having an In composition ratio more than 6% and a thickness greater than 160 nm is not preferable because it causes increase of the crystal defects. By making first InGaN light guide layer 14 thicker as compared to second light guide layer 16, on the other hand, the light intensity distribution in the vertical direction (layer-stacking direction) is slightly shifted toward the n-type layer side and becomes an asymmetrical distribution. As a result, light absorption due to the p-type impurity is suppressed so that it becomes possible to improve the external quantum efficiency in the laser device.

It is preferable that a total thickness of second InGaN guide layer 16 and nitride semiconductor intermediate layer 17 is in a range of 60 nm to 80 nm. The reason for this is that if the total thickness exceeds 80 nm, the distance between light-emitting layer 15 and the p-type layer becomes too large and thus the carrier loss is increased. In the case of the total thickness being less than 60 nm, on the other hand, it becomes difficult to sufficiently shift the light intensity distribution in the vertical direction (layer-stacking direction) toward the n-type layer side and thus light absorption is undesirably increased in the layers containing the p-type impurity of Mg.

First InGaN guide layer 14, light-emitting layer 15, second InGaN guide layer 16, and intermediate layer 17 are preferably non-doped from the viewpoint of enhancing the external quantum efficiency of the laser device.

It is preferable that light-emitting layer 15 is formed with one quantum well layer or includes two quantum well layer (a well layer/a barrier layer/a well layer). The reason for this is that a well layer more than the second does not cause a gain but acts as a light absorption layer. Therefore, it is preferable that light-emitting layer 15 includes one or two well layers.

Each well layer preferably has a thickness in a range of 1 nm to 3.4 nm and more preferably in a range of 1.5 nm to 2 nm. The reason for this is that it is necessary to form an InGaN well layer having a high In composition ratio in order to obtain a lasing wavelength not less than 430 nm, and if the thickness of such a well layer exceeds 3.4 nm, crystal defects tend to be generated because of the lattice strain. It is preferable that the barrier layer is also formed of InGaN, and the In composition ratio thereof is preferably the same as that of InGaN light guide layer from the viewpoint of the light confinement effect. The barrier layer preferably has a thickness in a range of 10 nm to 20 nm.

Nitride semiconductor intermediate layer 17 is preferably formed of GaN. With this intermediate layer, it becomes possible to relax the lattice mismatch between second InGaN light guide layer 16 and p-type AlGaN layer 18.

P-type AlGaN layer 18 and p-type AlGaN clad layer 19 are formed in contact with each other, and therebetween a layer having a relatively high refractive index as in a usual nitride semiconductor laser device is not provided. With this contact structure and first InGaN light guide layer of a thickness of at least 120 nm, the light intensity distribution in the vertical direction is not pulled toward the p-type layer side but effectively shifted toward the n-type layer side. As a result, it becomes possible to improve the external quantum efficiency of the laser device.

P-type AlGaN layer 18 preferably has an Al composition ratio in a range of 10% to 35% and more preferably in a range of 10% to 20%. P-type AlGaN layer 18 preferably has a thickness in a range of 8 nm to 20 nm. P-type AlGaN clad layer 19 preferably has an Al composition ratio in a range of 3% to 5% and smaller than that of n-type AlGaN clad layer 12. With these conditions, it becomes possible to decrease the operation voltage of the laser device.

Incidentally, it is possible to use Mg as the p-type impurity. Further, it goes without saying that a p-type GaN contact layer (not shown in FIG. 1) may be deposited on p-type AlGaN clad layer 19.

(Formation of InGaN Light Guide Layer)

First InGaN light guide layer should have an In composition ratio in a range of 3% to 6% and have a thickness of at least 120 nm. If such an InGaN layer is crystal-grown by a usual method, crystal defects are generated and phase separation into regions of high and low In composition ratios is caused in the InGaN layer. The InGaN layer having such a low crystalline quality is not suitable for the laser device. In the present invention, therefore, first InGaN light guide layer 14 is formed by a method as described below. It goes without saying that second InGaN light guide layer 16 may be formed by a method similar to that for first InGaN light guide layer 14.

A method for forming the first (or second) InGaN light guide layer according to the present Embodiment includes a crystal-growing step of forming a partial layer of the InGaN light guide layer, a growth-interrupting step, and repetition of these steps until the thickness of the InGaN light guide layer reaches a desired thickness. Schematic cross-sectional views of FIGS. 2 and 3 illustrate a method for forming the first (or second) InGaN light guide layer.

(Crystal-Growing Step)

Figure 2:
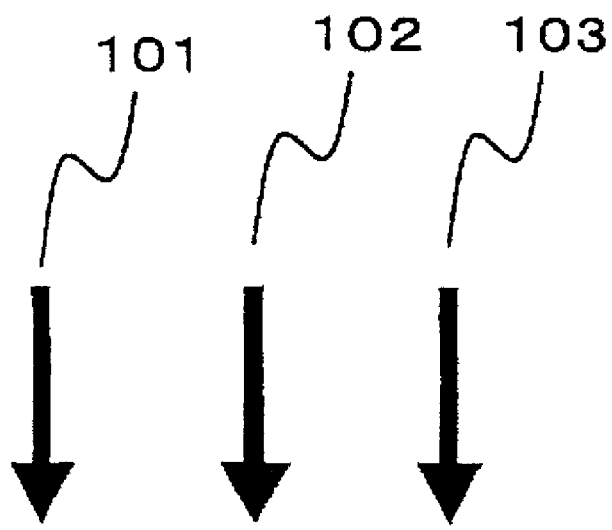
FIG. 2 is a schematic cross-sectional view showing a step of crystal-growing according to the present invention.
Figure 2:
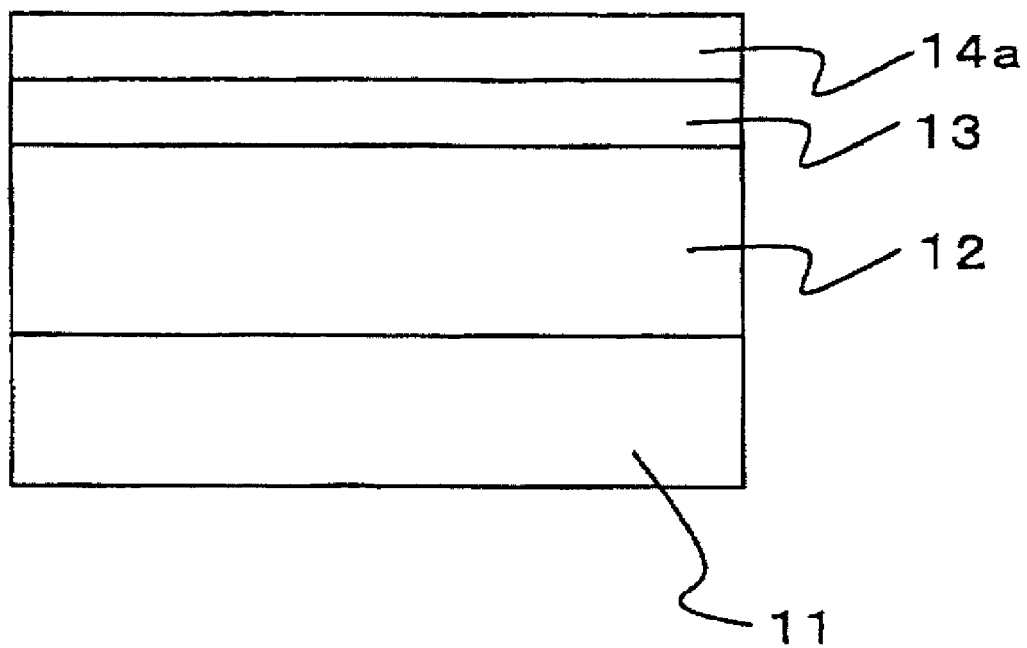
Figure 3:
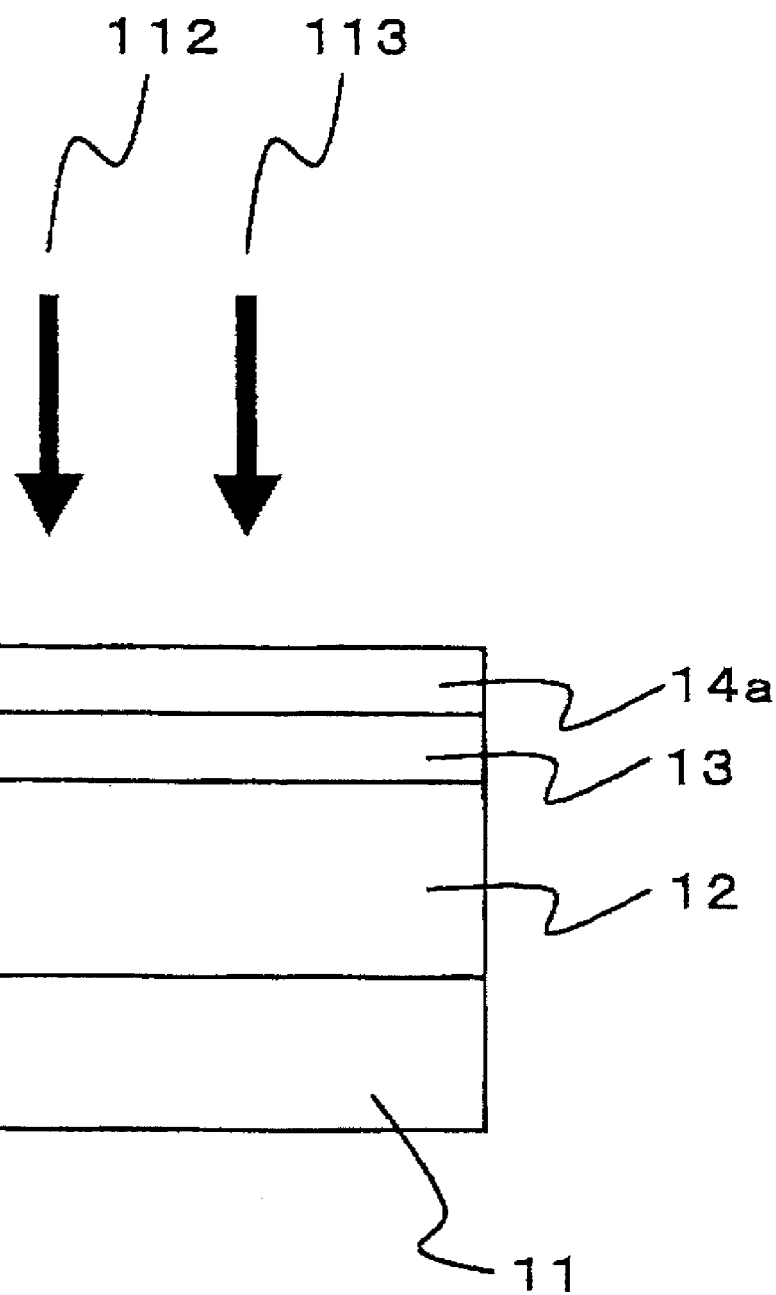
FIG. 3 is a schematic cross-sectional view showing a step of interrupting the crystal-growing according to the present invention.

In the crystal-growing step as shown in FIG. 2, a partial layer 14a of InGaN light guide layer 14 is deposited by supplying a III group element source 101 containing In and Ga, a first ammonia gas 102, and a first carrier gas 103 containing nitrogen and hydrogen.

Here, partial layer 14a corresponds to one of partitive divisions in the complete thickness of InGaN light guide layer 14. In other words, InGaN light guide layer 14 (see FIG. 1) is not formed by one crystal-growing step but formed up to the complete thickness by stacking plurality of partial layers 14a with a plurality crystal-growing steps.

Partial layer 14a of InGaN light guide layer 14 preferably has a thickness in a range of 25 nm to 40 nm. It is possible to obtain an effect of suppressing generation of crystal defects by stacking partial layers 14a to form InGaN light guide layer 14. The thickness of partial layer 14a greater than 40 nm is not preferable because it reduces the effect of suppressing generation of crystal defects. On the other hand, the thickness of partial layer 14a smaller than 25 nm is not preferable from the viewpoint of productivity because it increases necessary number of the crystal-growing steps for forming partial layers 14a to complete InGaN light guide layer 14.

When partial layer 14a of InGaN light guide layer 14 is formed on GaN layer 13, the substrate temperature is set to the same temperature as in the case of depositing light-emitting layer 15, and then a III group element source 101 containing In and Ga, a first ammonia gas 102, and a first carrier gas 103 containing nitrogen and hydrogen are introduced into MOCVD (metal organic chemical vapor deposition) apparatus (see FIG. 2). Here, the temperature suitable for crystal-growing partial layer 14a of InGaN light guide layer 14 is in a range of 600° C. to 850° C.

In order to obtain a high In composition ratio, it is necessary to increase the supply amount of the III group element source at a relatively lower crystal growth temperature. In the case of forming first InGaN light guide layer 14 with such condition, excess In atoms that can not have been taken in the layer tend to precipitate on the surface of the layer (segregation of In atoms) and then crystal defects generated in the layer is increased. This tendency becomes more significant as the thickness of InGaN light guide layer 14 is increased. In the present invention, therefore, InGaN light guide layer 14 is divided into some partial layers each having a thickness in a range of 25 nm to 40 nm.

In the crystal-growing step shown in FIG. 2, the first carrier gas necessarily contains hydrogen. The reason for this is that hydrogen should be supplied during growth of the InGaN light guide layer in order to remove excess In atoms on the crystal-growing surface. Usually, only nitrogen is used as a carrier gas during formation of an InGaN layer. The reason for this is that it is not easy to form an InGaN layer having a high In composition ratio by using carrier gas containing hydrogen. Further, if a nitrogen carrier gas unintentionally contains hydrogen, the In composition ratio fluctuates and a desired InGaN layer can not obtained.

As a result of the present inventors' experiment, however, it was found that in the case of the In composition ratio in III group elements being not more than about 8%, a desired InGaN layer can be obtained even by using a carrier gas containing hydrogen. It was also found that an InGaN layer formed using a carrier gas containing hydrogen shows higher photoluminescence (i.e., better crystalline quality) as compared to one formed using a carrier gas not containing hydrogen. It was further found that fluctuation of the In composition ratio is very small, which is related to variation of the hydrogen content during repetition of the crystal-growing step of FIG. 2 and the growth-interrupting step described later.

First carrier gas preferably has a hydrogen concentration in a range of 1% to 20%. By supplying hydrogen in this concentration range, it is possible to remove excess In atoms on the crystal-growing surface and then form the InGaN light guide layer having a good crystalline quality. Here, the hydrogen concentration in first carrier gas 103 means {hydrogen flow rate in first carrier gas 103/(hydrogen flow rate+nitrogen flow rate in first carrier gas 103)}×100.

In the case that the hydrogen concentration of first carrier gas 103 is the same as that of second carrier gas 113 described later, fluctuation of the In composition ratio is further suppressed in the InGaN light guide layer and then the electron energy band gap level of the InGaN light guide layer can be stabilized.

If the gas flow rate largely changes between the crystal-growing step of FIG. 2 and the growth-interrupting step in a MOCVD method for crystal growth, stabilization of the reaction gas atmosphere tends to be retarded due to a problem of followability of the gas flow speed to the flow rate change. If such retardation occurs in stabilization of the reaction gas atmosphere, crystal growth does not become stable in the repeated crystal-growing steps and then it becomes difficult to form the desired InGaN light guide layer. From this point of view, it is preferable that the total flow rate of first ammonia gas 102 and first carrier gas 103 is the same as that of second ammonia gas 112 and second carrier gas 113 described later. Under such condition, change of the gas flow rate becomes small at the process change from the crystal-growing step to the growth-interrupting step and vice versa and then it becomes possible to form the InGaN light guide layer having the desired crystalline quality.

(Growth-Interrupting Step)

A schematic cross-sectional view of FIG. 3 shows a growth-interrupting step after the crystal-growing step of forming partial layer 14a of InGaN light guide layer 14. In this growth-interrupting step, supply of III group element source used in the crystal-growing step of FIG. 2 is stopped, and then a second ammonia gas 112 and a second carrier gas 113 composed of nitrogen and hydrogen is supplied to interrupt the crystal growth for a prescribed time period. With this growth-interrupting step, it is possible to remove excess In atoms on a surface of the InGaN light guide layer having a high In composition ratio and suppress generation of crystal defects in the InGaN layer. Then, by repeating the crystal-growing step of FIG. 2 and the growth-interrupting step of FIG. 3, it is possible to form the thick (at least 120 nm) InGaN light guide layer having a good crystalline quality.

Excess In atoms remained on the surface of the partial layer 14a of InGaN light guide layer 14 are removed mainly by etching effect of hydrogen contained in second carrier gas 113. Since hydrogen has strong etching effect, there is a possibility that it also etches a surface or a part of partial layer 14a formed in the crystal-growing step of FIG. 2 thereby causing surface roughness and makes it difficult to attain the desired layer thickness. To prevent this possibility, second ammonia gas 112 is also supplied in the growth-interrupting step. This second ammonia gas 112 also causes the effect of removing excess In atoms on the layer surface, though the etching effect thereof is not as much as that of hydrogen contained in second carrier gas 113. This means that the flow rate of hydrogen having strong etching effect can be decreased by increasing the flow rate of second ammonia gas 112. The proportion of hydrogen contained in second carrier gas 113 to second ammonia gas is preferably in a range of 1% to 35%. Here, the proportion of hydrogen contained in second carrier gas 113 to second ammonia gas 112 means (hydrogen flow rate in second carrier gas/second ammonia gas)×100.

The flow rate of second ammonia gas 112 is preferably not less than and more preferably in a range of 1.1 to 3 times that of first ammonia gas 102 used for formation of partial layer 14a of InGaN light guide layer 14. The reason for this is that by increasing the flow rate of second ammonia gas 112 as compared to that of first ammonia gas 102 it becomes possible to enhance the effect of removing excess In atoms on the layer surface and decrease the flow rate of hydrogen having strong etching effect.

The flow rate of hydrogen in second carrier gas 113 is preferably in a range of 1% to 20%. With hydrogen in this range, it is possible to remove excess In atoms on the layer surface. The hydrogen concentration exceeding 20% is not preferable because the etching effect on partial layer 14a of InGaN light guide layer becomes too much. Here, the hydrogen concentration in second carrier gas 113 means {hydrogen flow rate in second carrier gas/(hydrogen flow rate+nitrogen flow rate in second carrier gas)}×100.

The time period for the growth-interruption is preferably in a range of 3 sec. to 180 sec. The interruption time shorter than 3 sec. is not preferable because it becomes difficult to obtain sufficient effect of removing excess In atoms. The interruption time longer than 180 sec. is also not preferable because partial layer 14a of InGaN light guide layer 14 is damaged by etching.

The substrate temperature during the growth-interruption is preferably the same as that during formation of partial layer 14a of InGaN light guide layer 14. The reason for this is that it is very difficult to change and stabilize the substrate temperature within the optimal interruption time (in the range of 3 sec. to 180 sec.). Since variation of the substrate temperature directly influences the effect of removing excess In atoms on the crystal-growing surface, it becomes difficult under the unstable substrate temperature to obtain the uniformity and reproducibility of the In composition ratio in InGaN light guide layer 14.

While the crystal growth has been explained using an MOCVD apparatus in the above Embodiment, it goes without saying that the crystal growth may also be carried out by using an MOMBE (metal organic molecular beam epitaxy) apparatus, HYPE (hydride vapor phase epitaxy) apparatus, or the like.

EXAMPLE

A schematic cross-sectional view of FIG. 4 shows a wafer having a nitride semiconductor laser structure produced in one Example of the present invention. A method for fanning this nitride semiconductor laser structure wafer corresponds to the method for forming this nitride semiconductor laser structure wafer described in the above Embodiment.

This nitride semiconductor laser structure wafer 220 includes an n-type GaN layer 201, an n-type AlGaN clad layer 202, a non-doped GaN layer 203, a first non-doped InGaN light guide layer 204, a light-emitting layer 205, a second non-doped InGaN light guide layer 206, a non-doped GaN intermediate layer 207, a p-type AlGaN layer 208, a p-type AlGaN clad layer 209, and p-type GaN contact layer 210 stacked in this order on a (0001) plane of a n-type GaN substrate 200.

In formation of nitride semiconductor laser structure wafer 220, n-type GaN substrate 200 is first heated to 1050° C. and maintained at this temperature in an MOCVD apparatus, and then n-type GaN layer 201 of 0.5 μm thickness is formed on n-type GaN substrate 200 by introducing TMG (trimethylgallium) for a source of a III-group element, ammonia gas, and a doping gas of $SiH_4$ containing Si. This n-type GaN layer 201 is formed to improve the surface morphology and relax the residual surface stress and strain on polished n-type GaN substrate 200 thereby to provide a surface suitable for epitaxial crystal growth.

Subsequently, TMA (trimethylaluminum) for a source of a III-group element is also introduced in the MOCVD apparatus to form n-type AlGaN clad layer 202 of 2.5 μm thickness having an Si impurity concentration of $5 \times 10^{17}/cm^3$. In this n-type AlGaN clad layer 202, the Al composition ratio in III group elements is 5%.

Next, non-doped GaN layer 203 of 0.2 μm thickness is formed by stopping supply of TMA and $SiH_4$ into the MOCVD apparatus.

Thereafter, the substrate temperature is lowered to 800° C., and then TMG and trimethylindium (TMI) is supplied to form first non-doped $In_{0.035}Ga_{0.965}N$ light guide layer 204 of 150 nm thickness.

Light-emitting layer 205 including two quantum well layers is formed on first $In_{0.035}Ga_{0.965}N$ light guide layer 204. More specifically, in formation of this light-emitting layer 205, a non-doped $In_{0.13}Ga_{0.87}N$ well layer of 3 nm thickness, a non-doped $In_{0.035}Ga_{0.965}N$ barrier layer of 16 nm thickness, and a non-doped $In_{0.13}Ga_{0.87}N$ well layer of 3 nm thickness are stacked in this order.

Second non-doped $In_{0.035}Ga_{0.965}N$ light guide layer 206 of 70 nm thickness and non-doped GaN intermediate layer 207 of 10 nm thickness are stacked in this order on light-emitting layer 205.

Thereafter, the substrate temperature is raised to 1120° C. to sequentially form Mg-doped $Al_{0.2}Ga_{0.8}N$ layer 208 of 20 nm thickness, Mg-doped $Al_{0.04}Ga_{0.94}N$ clad layer 209 of 0.6 μm thickness, and Mg-doped p-type GaN contact layer 210 of 0.1 μm thickness, thereby finishing crystal growth of nitride semiconductor laser structure wafer 220. Here, it is possible to use $(EtCp)_2Mg$ for a source gas containing Mg.

In the following, further explanation is given for formation of first InGaN light guide layer 204 that is an important feature of the present invention. It is noted that second InGaN light guide layer 206 can also be formed by a method similar to that described below.

In crystal growth of first InGaN light guide layer according to the present Example, a non-doped $In_{0.035}Ga_{0.965}N$ layer of 30 nm thickness is formed as a partial layer of first InGaN light guide layer by using TMI and TMG for a III group element source containing In and Ga (corresponding to 101 in FIG. 2) and supplying a first ammonia gas of 6 L/min. (corresponding 102 in FIG. 102) together with a first carrier gas containing nitrogen of 8 L/min. and hydrogen of 0.5 L/min. (corresponding to 103 in FIG. 2) at a substrate temperature of 800° C.

Subsequently, in the growth-interrupting step according to the present Example, the crystal growth is stopped for 40 sec. at the same substrate temperature of 800° C. by stopping supply of the III group element source containing TMI and TMG and supplying a second ammonia gas of 6 L/min. (corresponding to 112 in FIG. 3) together with a carrier gas containing nitrogen of 8 L/min. and hydrogen of 0.5 L/min. (corresponding to 113 in FIG. 3). Then, the first InGaN light guide layer is formed to a 150 nm thickness by repeating 5 times the above described crystal-growing step and growth-interrupting step.

The nitride semiconductor laser device obtained according to the present Example showed excellent laser characteristics, i.e., lasing wavelength of 440 nm, operation voltage of 5.3 V, external quantum efficiency of 1.5, and threshold current density of 2.5 $kA/cm^2$.

As described above, according to the present invention, it becomes possible to obtain improvements of laser characteristics such as decrease of the operation voltage, increase of the external quantum efficiency and decrease of the threshold lasing current density in the nitride semiconductor laser device having a emission wavelength in the range of 430 nm to 540 nm. Further, such improved laser device can preferably be used in combination with phosphors in a white light source having a high luminance, used as a blue of green light source, used in light display device including an RGB (red, green, blue) light source, and used in a laser projector including an RGB light source.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for forming an InGaN layer, the method comprising:
    growing a crystal layer by supplying a group III element source, a first ammonia gas, and a first carrier gas, the group III element source containing In and Ga, the first carrier gas containing nitrogen and hydrogen,
    interrupting said growing step for a time period by stopping the supplying of said group III element source and supplying a second ammonia gas and a second carrier gas containing nitrogen and hydrogen,
    alternately repeating said growing step and said interrupting step to form said InGaN layer having a first thickness.

2. The method according to claim 1, wherein said first thickness of said InGaN layer is in a range of 120 nm to 160 nm.

3. The method according to claim 1, wherein said growing step produces the crystal layer having a thickness in a range of 25 nm to 40 nm during the supplying of said group III element source, said first ammonia gas, and said first carrier gas.

4. The method according to claim 1, wherein said first carrier gas contains hydrogen in a range of 1% to 20%.

5. The method according to claim 4, wherein said second carrier gas contains a same concentration of hydrogen as said first carrier gas.

6. The method according to claim 1, wherein a total flow rate of said second ammonia gas and said second carrier gas is equal to a total flow rate of said first ammonia gas and said first carrier gas.

7. The method according to claim 1, wherein a proportion of the hydrogen in said second carrier gas to said second ammonia gas is in a range of 1% to 35%.

8. The method according to claim 1, wherein a flow rate of said second ammonia gas is greater than that of said first ammonia gas.

9. The method according to claim 8, wherein the flow rate of said second ammonia gas is in a range of 1.1 to 3 times that of said first ammonia gas.

10. The method according to claim 1, wherein said second carrier gas contains hydrogen in a range of 1% to 20%.

11. The method according to claim 1, wherein said time period is in a range of 3 seconds to 180 seconds.

* * * * *